(12) United States Patent
Lee

(10) Patent No.: US 8,958,043 B2
(45) Date of Patent: Feb. 17, 2015

(54) 3D LIQUID CRYSTAL DISPLAY DEVICE AND PIXEL STRUCTURE THEREOF

(75) Inventor: Chia-Yu Lee, Guangdong (CN)

(73) Assignee: Shenzhen China Star Optoelectronics Technology Co., Ltd., Guangdong (CN)

( * ) Notice: Subject to any disclaimer, the term of this patent is extended or adjusted under 35 U.S.C. 154(b) by 169 days.

(21) Appl. No.: 13/639,069

(22) PCT Filed: Aug. 8, 2012

(86) PCT No.: PCT/CN2012/079807
§ 371 (c)(1),
(2), (4) Date: Oct. 2, 2012

(87) PCT Pub. No.: WO2014/005365
PCT Pub. Date: Jan. 9, 2014

(65) Prior Publication Data
US 2014/0009708 A1    Jan. 9, 2014

(30) Foreign Application Priority Data
Jul. 5, 2012 (CN) .......................... 2012 1 0230847

(51) Int. Cl.
*G02F 1/1335* (2006.01)
*G02F 1/1343* (2006.01)
*G02F 1/1362* (2006.01)
*H01L 27/15* (2006.01)
*G02F 1/13363* (2006.01)
*H04N 13/04* (2006.01)

(52) U.S. Cl.
CPC .... *G02F 1/136286* (2013.01); *G02F 1/134336* (2013.01); *G02F 1/133528* (2013.01); *G02F 1/133514* (2013.01); *H01L 27/156* (2013.01); *G02F 1/13363* (2013.01); *G02F 1/134309* (2013.01); *H04N 13/0434* (2013.01); *H04N 13/0422* (2013.01); *G02F 2001/133631* (2013.01); *G02F 2001/134345* (2013.01); *H04N 2213/001* (2013.01)
USPC .............. 349/144; 349/15; 349/139; 349/146

(58) Field of Classification Search
CPC ................... G02F 1/133514; G02F 1/134309; G02F 1/134336; G02F 1/136286; G02F 2001/134345
See application file for complete search history.

(56) References Cited

U.S. PATENT DOCUMENTS

| 6,703,989 B1 * | 3/2004 | Harrold et al. .................. 345/32 |
| 2007/0296898 A1 * | 12/2007 | Cho et al. ....................... 349/139 |
| 2010/0066963 A1 * | 3/2010 | Hwang et al. ................. 349/139 |
| 2010/0238389 A1 * | 9/2010 | Chan et al. .................... 349/107 |

* cited by examiner

*Primary Examiner* — Nathanael R Briggs
(74) *Attorney, Agent, or Firm* — Kirton McConkie; Evan R. Witt

(57) ABSTRACT

The present invention discloses a 3D liquid crystal display device and a pixel structure thereof. The pixel structure includes three gate lines, a data line and three pixel electrodes. The gate lines are arranged along a first direction and cross the data line to define three sub-pixel regions. Each of the pixel electrodes includes a primary electrode portion and an extension electrode portion. The primary electrode portion of each of the pixel electrodes is disposed in the corresponding sub-pixel region, and the extension electrode portions of all the pixel electrodes are disposed together in one of the sub-pixel regions. The pixel structure can improve a color washout problem of the 3D liquid crystal display device under top or bottom view angles.

13 Claims, 8 Drawing Sheets

3D LIQUID CRYSTAL DISPLAY DEVICE AND PIXEL STRUCTURE THEREOF

BACKGROUND OF THE INVENTION

1. Field of the Invention

The present invention relates to a pixel structure of a liquid crystal display device, especially to a 3D liquid crystal display device and a pixel structure thereof.

2. Description of the Related Art

With reference to FIG. 1, in a conventional 3D display system, images from a liquid crystal display panel of the 3D display system will first travel through a polarizer 90 so as to turn into linearly polarized images. The linearly polarized images then travel through a λ/4 patterned retarder plate 91. The λ/4 patterned retarder plate 91 has a plurality of first phase retarder rows 910 and a plurality of second phase retarder rows 911 and can convert the linearly polarized images into left-handed circularly polarized images and right-handed circularly polarized images and use the left-handed circularly polarized images and right-handed circularly polarized images as left-eye input images and right-eye input images, respectively. A pair of polarized glasses 8 worn by an observer has two lenses, both of which are composed of a quarter-wave plate 80 and a polarizer 81. The images including the left-handed circularly polarized images and right-handed circularly polarized images first travel through the quarter-wave plates 80 of the lenses to be converted into linearly polarized images, then travel through the polarizers 81 of the lenses and arrive at the left and right eyes of the observer, respectively. Because the polarizers 81 of the lenses have different polarization directions, the user's left eye can only see the left-eye input images and the right eye can only see the right-eye input images. Hence, it can achieve a three-dimensional effect.

Furthermore, the pixel structure of the liquid crystal display device can be divided into single-gate pixel structure and tri-gate pixel structure according to the driving type of the pixel structure. With reference to FIGS. 2, 3 and 6, FIG. 2 is a schematic view of a pixel arrangement of a conventional liquid crystal display device having a single-gate pixel structure; FIG. 3 is a schematic view of pixel arrangement of a conventional liquid crystal display device having a tri-gate pixel structure; FIG. 6 is a schematic view of a conventional tri-gate pixel structure. As shown in FIG. 2, a plurality of sub-pixel regions 600, 601, 602 of a pixel unit 60 of a single-gate pixel structure 6 are arranged along a length direction of a gate line; and as shown in FIG. 3 and FIG. 6, a plurality of sub-pixel regions 500, 501, 502 of a pixel unit 50 of a tri-gate pixel structure are arranged along a length direction of a data line, and there are pixel electrodes 52R, 52G, 52B respectively mounted in those sub-pixel regions 500, 501, 502 and respective correspond to photoresists with different colors. Under the same resolution, comparing the liquid crystal display device having the single-gate pixel structure 6, the number of gate lines 710 of the liquid crystal display device having the tri-gate pixel structure 5 is increased by three times, and the number of data lines 700 of the liquid crystal display device is decreased by three times, hence a gate driver 71 of the liquid crystal display device having tri-gate pixel structure will use more gate driving chips and a source driver 70 thereof will use less source driving chips. Since the manufacturing cost and power consumption of the gate driving chips are relatively lower, therefore using tri-gate pixel structure can reduce the manufacturing cost and power consumption of the liquid crystal display device.

However, when the tri-gate pixel structure 5 in FIG. 3 is used in a 3D liquid crystal display device, the 3D liquid crystal display device will have a color washout problem occurring at top and bottom view angles. With reference to FIG. 4, when an observer wearing a pair of polarized glasses to see the screen of the device through the first phase retarder rows 910 and the second phase retarder rows 911 of a quarter-wave plate 9 from a horizontal view angle, a top view angle or a bottom view angle, the color-mixing effect received by the eyes of the observer will have different color-mixing effects. For example, in FIG. 5A, under a horizontal view angle, the colors of the sub-pixels of the pixel structure seen by the observer through the second phase retarder row 911 are arranged in an order of R, G, B; in FIG. 5B, under a top view angle (from top to bottom), the colors of the sub-pixels of the pixel structure seen by the observer through the second phase retarder row 911 turn to be arranged in an order of G, B, R. Because the first phase retarder rows 910 and the second phase retarder rows 911 are used to form the left-eye and right-eye input images, the first phase retarder rows 910 and the second phase retarder rows 911 corresponding to the wrong pixel structures will lead to a color washout problem.

Therefore, it is necessary to provide a 3D liquid crystal display device and a pixel structure thereof to overcome the problems existing in the conventional technology.

SUMMARY OF THE INVENTION

In view of the shortcomings of the conventional technology, the main objective of the invention is to provide a 3D liquid crystal display device and a pixel structure thereof to overcome the color washout problem of a 3D liquid crystal display device under top or bottom view angles.

In order to achieve the foregoing object of the present invention, the present invention provides a pixel structure of a 3D liquid crystal display device having:

three gate lines arranged along a first direction;

a data line crossing the gate lines to define three sub-pixel regions, and the sub-pixel regions are arranged along the first direction; and three pixel electrodes, and each of the pixel electrodes has a primary electrode portion and an extension electrode portion connected to the primary electrode portion, wherein the primary electrode portions of the pixel electrodes are disposed in the sub-pixel regions, respectively; the extension electrode portions of the pixel electrodes are disposed together in one of the sub-pixel regions.

In one embodiment of the present invention, the pixel structure further includes three thin-film transistors that are disposed in the sub-pixel regions, respectively, and a gate of each of the thin-film transistors is electrically connected to a corresponding one of the gate lines; a source of each of the thin-film transistors is electrically connected to the data line; and a drain of each of the thin-film transistors is electrically connected to a corresponding one of the pixel electrodes.

In one embodiment of the present invention, the sub-pixel regions are a first sub-pixel region, a second sub-pixel region and a third sub-pixel region; the primary electrode portions of the first, the second and the third pixel electrodes are disposed in the first, the second and the third pixel regions, respectively; the extension electrode portions of the first, the second and the pixel electrodes are disposed in the first sub-pixel region; and the pixel structure corresponds to a photoresist structure of a color filter wherein the photoresist structure includes a first photoresist region, a second photoresist region and a third photoresist region, wherein the positions of the first, the second and the third photoresist corresponds to the positions of the first, the second and the third sub-pixel regions, respectively; the first photoresist region accommodates a first photoresist, a second photoresist and a third photoresist; the second photo region accommodates a second photoresist; and the third photoresist region accommodates a third photoresist.

In one embodiment of the present invention, the shape and the position of the first photoresist in the first photoresist region correspond to the overall shape and the overall position of both the primary electrode portion and the extension electrode portion of the first pixel electrode; the shape and the position of the second photoresist in the first photoresist region correspond to the shape and the position of the extension electrode portion of the second pixel electrode; the shape and the position of the third photoresist in the first photoresist region correspond to the shape and the position of the extension electrode portion of the third pixel electrode;

the shape and the position of the second photoresist in the second photoresist region correspond to the shape and the position of the primary electrode portion of the second pixel electrode; and the shape and the position of the third photoresist in the third photoresist region correspond to the shape and the position of the primary electrode portion of the third pixel electrode.

In one embodiment of the present invention, the extension electrode portion of the second pixel electrode insulatedly crosses over at least one of the gate lines to be connected to the primary electrode portion of the second pixel electrode; the extension electrode portion of the third pixel electrode insulatedly crosses over at least one of the gate lines to be connected to the primary electrode portion of the third pixel electrode.

The present invention further provides a 3D liquid crystal display device comprising:

a first substrate including a plurality of pixel regions, and each of the pixel regions accommodates a pixel structure, and the pixel structure has:

three gate lines arranged along a first direction;

a data line crossing the gate lines to define three sub-pixel regions, and the sub-pixel regions are arranged along the first direction; and three pixel electrodes, and each of the pixel electrodes has a primary electrode portion and an extension electrode portion connected to the primary electrode portion, wherein the primary electrode portions of the three pixel electrodes are disposed in the sub-pixel regions, respectively; the extension electrode portions of the pixel electrodes are disposed together in one of the sub-pixel regions;

a second substrate being opposite to the first substrate;

a liquid crystal layer mounted between the first substrate and the second substrate; and a phase retarder film being overlapped with the second substrate.

In one embodiment of the present invention, the pixel structure further includes three thin-film transistors that are disposed in the sub-pixel regions, respectively, and a gate of each of the thin-film transistors is electrically connected to a corresponding one of the gate lines; a source of each of the thin-film transistors is electrically connected to the data line; and a drain of each of the thin-film transistors is electrically connected to a corresponding one of the pixel electrodes.

In one embodiment of the present invention, the 3D liquid crystal display device further comprises a polarizer mounted on the second substrate; and the phase retarder film is mounted on an outer surface of the polarizer and has:

a plurality of first phase retarder rows; and a plurality of second phase retarder rows, and the second phase retarder rows and the first phase retarder rows are alternately arranged.

In one embodiment of the present invention, an angle between an optical axis of each of the first phase retarder rows and a transmission axis of the polarizer is 135 degrees; and an angle between an optical axis of each of the second phase retarder rows and a transmission axis of the polarizer is 45 degrees.

In one embodiment of the present invention, the sub-pixel regions are a first sub-pixel region, a second sub-pixel region and a third sub-pixel region; the primary electrode portions of the first, the second and the third pixel electrodes are disposed in the first, the second and the third pixel regions, respectively; the extension electrode portions of the first, the second and the pixel electrodes are disposed in the first sub-pixel region; and the second substrate has a color filter mounted thereon, and the color filter has a photoresist structure corresponding to the pixel structure on the first substrate; and the photoresist structure includes a first photoresist region, a second photoresist region and a third photoresist region, wherein the positions of the first, the second and the third photoresist corresponds to the positions of the first, the second and the third sub-pixel regions, respectively; the first photoresist region accommodates a first photoresist, a second photoresist and a third photoresist; the second photo region accommodates a second photoresist; and the third photoresist region accommodates a third photoresist.

The present invention further provides another pixel structure of a 3D liquid crystal display device comprising:

three gate lines arranged along a first direction;

a data line crossing the gate lines to define three sub-pixel regions, and the three sub-pixel regions are a first sub-pixel region, a second sub-pixel region and a third sub-pixel region, and the sub-pixel regions are arranged along the first direction;

three pixel electrodes which are a first pixel electrode, a second pixel electrode and a third pixel electrode, and each of the pixel electrodes has a primary electrode portion and an extension electrode portion connected to the primary electrode portion, wherein the primary electrode portions of the first, second and third pixel electrodes are disposed in the first, second and third sub-pixel regions, respectively; the extension electrode portions of the first, second and third pixel electrodes are disposed in the first sub-pixel region; and three thin-film transistors which are a first thin-film transistor, a second thin-film transistor and a third thin-film transistor, and the thin-film transistors are disposed in the first, second and third sub-pixel regions, respectively, wherein a gate of each of the thin-film transistors is electrically connected to a corresponding one of the gate lines; a source of each of the thin-film transistors is electrically connected to the data line; and a drain of each of the thin-film transistors is electrically connected to a corresponding one of the pixel electrodes.

In one embodiment of the present invention, the first thin-film transistor is connected to the extension electrode portion of the first pixel electrode; the second thin-film transistor is connected to the primary electrode portion of the second pixel electrode; the third thin-film transistor is connected to the primary electrode portion of the third pixel electrode.

In one embodiment of the present invention, the extension electrode portion of the second pixel electrode insulatedly crosses over at least one of the gate lines to be connected to the primary electrode portion of the second pixel electrode; the extension electrode portion of the third pixel electrode insulatedly crosses over at least one of the gate lines to be connected to the primary electrode portion of the third pixel electrode.

The present invention is to divide each pixel electrode that forms a sub-pixel into a primary electrode portion and an extension electrode portion in a tri-gate pixel arrangement, and place the extension electrode portion of each pixel electrode of one pixel unit in the same sub-pixel region, thus, when see the screen from a top view angle, three colors of R, G, B can be seen at the same time to achieve an effect of color compensation to improve the color washout problem which occurs due to change of view angle.

DETAILED DESCRIPTION OF THE PREFERRED EMBODIMENTS

The foregoing objects, features and advantages adopted by the present invention can be best understood by referring to the following detailed description of the preferred embodiments and the accompanying drawings. Furthermore, the directional terms described in the present invention, such as upper, lower, front, rear, left, right, inner, outer, side and etc., are only directions referring to the accompanying drawings, so that the used directional terms are used to describe and understand the present invention, but the present invention is not limited thereto.

Figure 1:
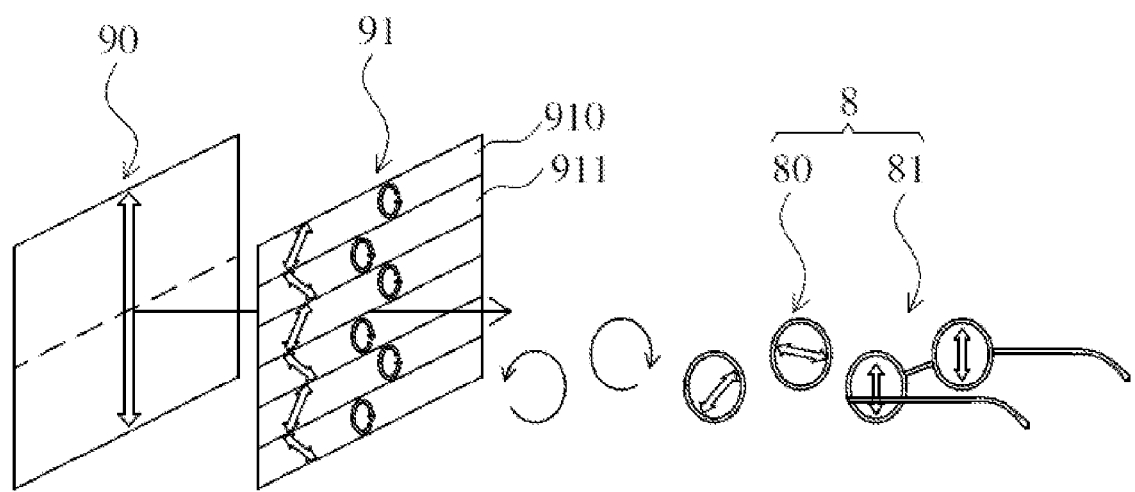
FIG. 1 is a schematic view of a conventional 3D display system.
Figure 2:
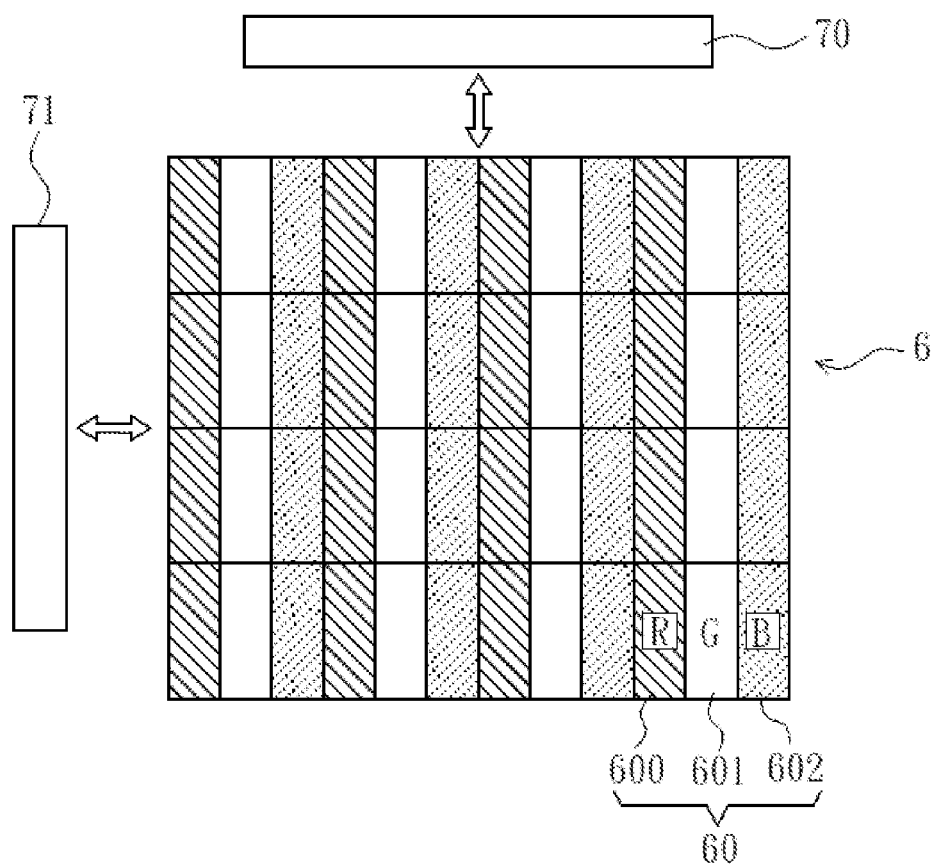
FIG. 2 is a schematic view of pixel arrangement of a conventional liquid crystal display device having a single-gate pixel structure.
Figure 3:
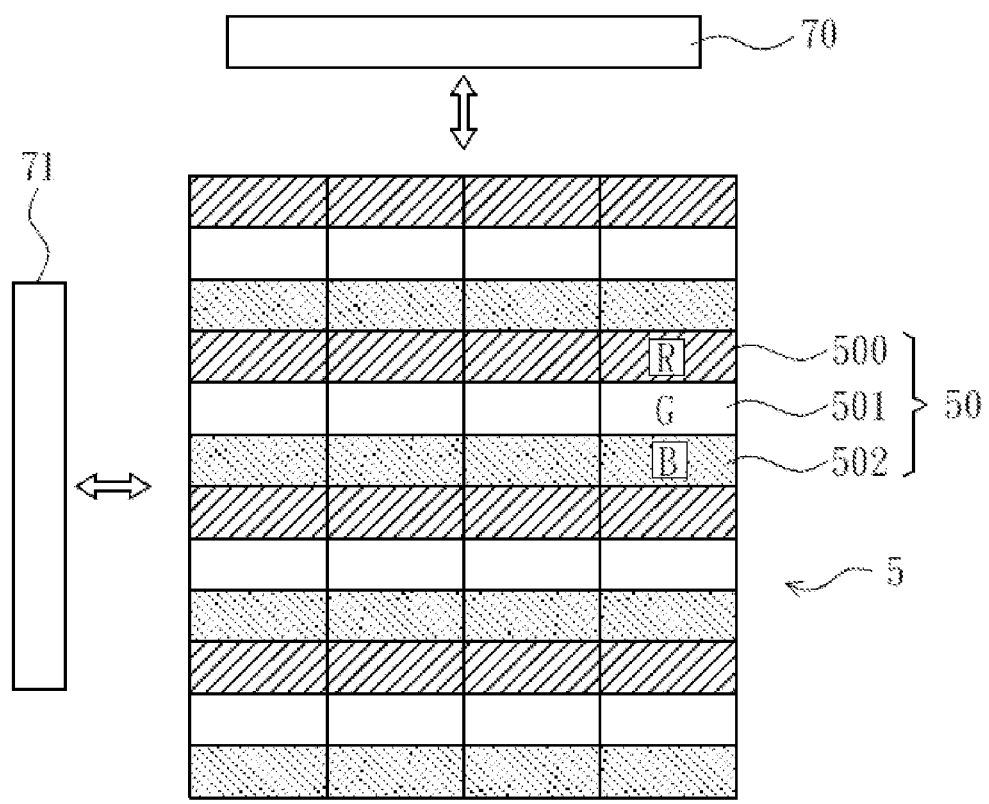
FIG. 3 is a schematic view of pixel arrangement of a conventional liquid crystal display device having a tri-gate pixel structure.
Figure 4:
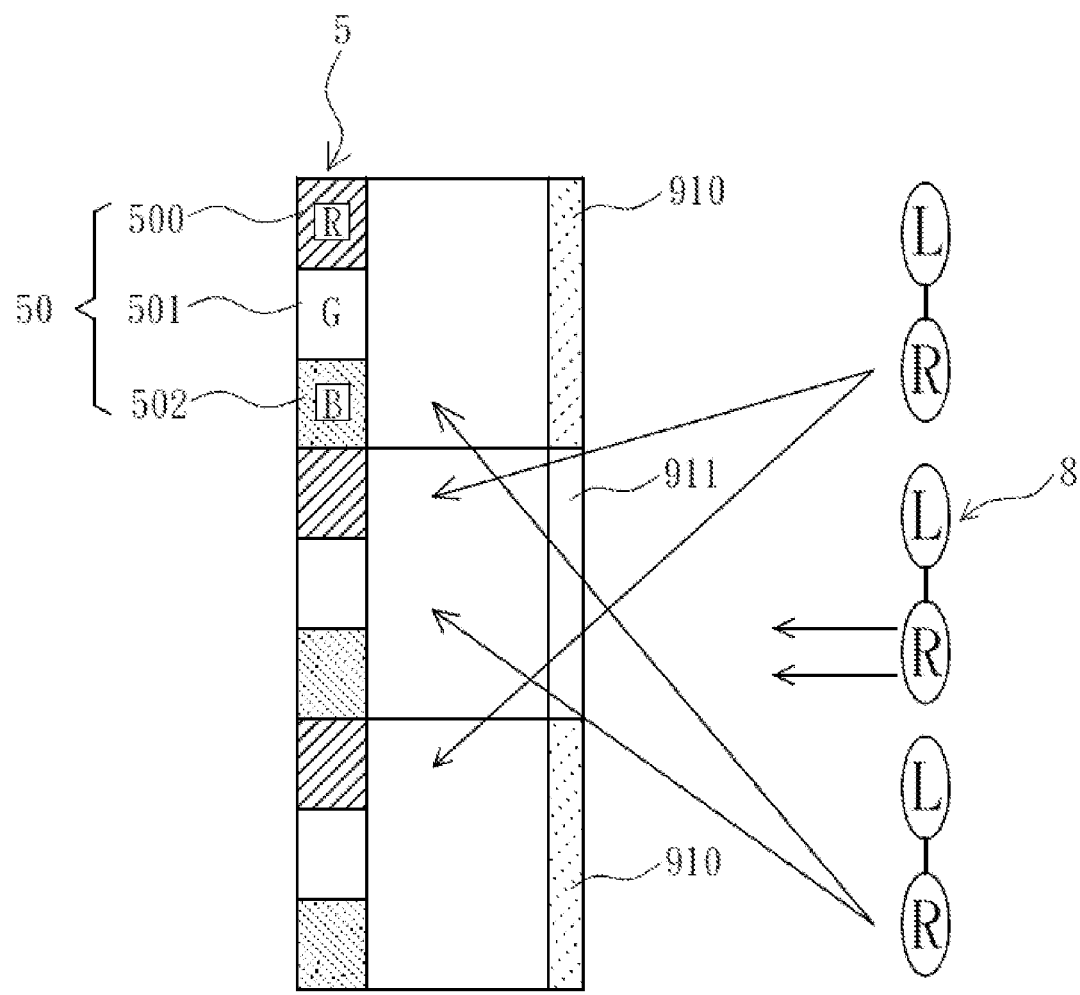
FIG. 4 is a schematic view illustrating the tri-gate pixel structure of a 3D liquid crystal display device seen from different view angles.
Figure 5A:
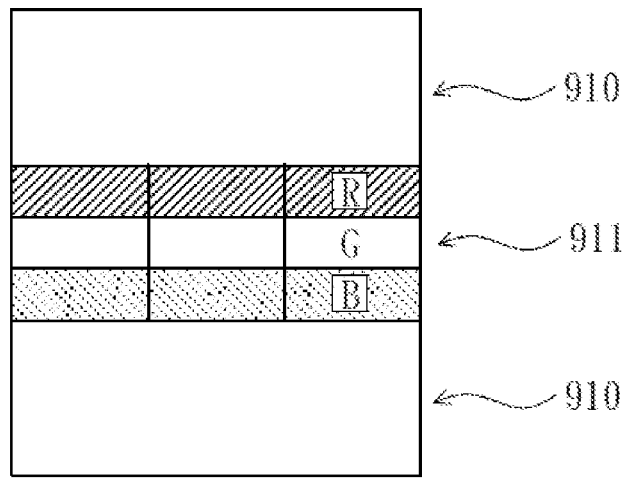
FIG. 5A is a schematic view of pixel arrangement when seeing the tri-gate pixel structure of the 3D liquid crystal display device from a horizontal view angle.
Figure 5B:
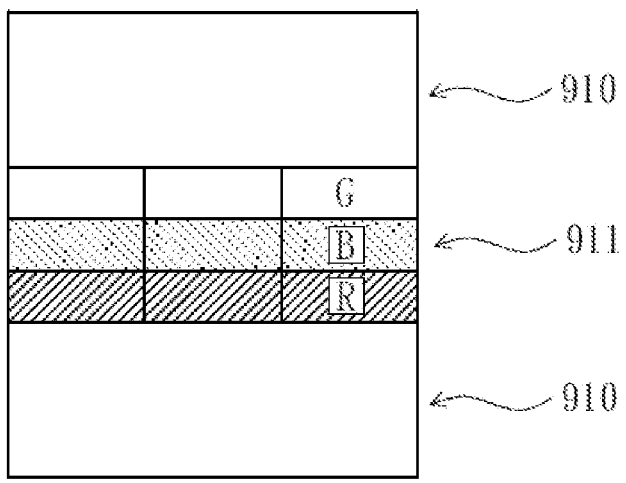
FIG. 5B is a schematic view of pixel arrangement when seeing the tri-gate pixel structure of the 3D liquid crystal display device from a top view angle.
Figure 6:
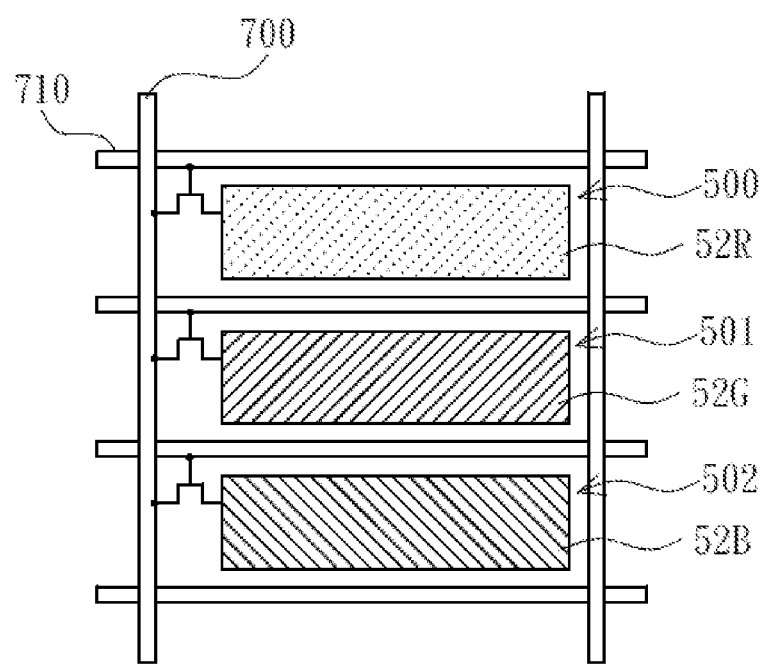
FIG. 6 is a schematic view of a conventional tri-gate pixel structure.
Figure 7:
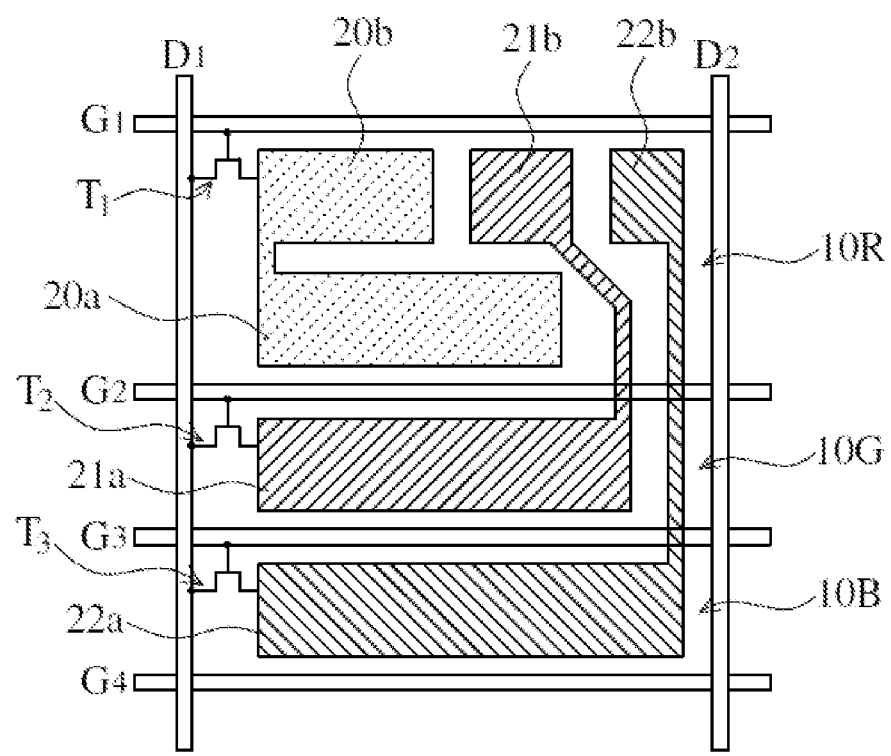
FIG. 7 is a schematic view of a preferred embodiment of a pixel structure of a 3D liquid crystal display device in accordance with the present invention.

With reference to FIG. 7, FIG. 7 is a schematic view of a preferred embodiment of a pixel structure of a 3D liquid crystal display device in accordance with the present invention. As shown in FIG. 7, the pixel structure in each pixel region comprises three gate lines G1, G2, G3, a first data line D1, a second data line D2, three pixel electrodes and three thin-film transistors T1, T2, T3.

The gate lines G1, G2, G3 are arranged along a first direction.

The first data line D1 and the second data line D2 cross the gate lines G1, G2, G3 so as to define three oblong sub-pixel regions 10R, 10G, 10B with the gate lines G1, G2, G3. The sub-pixel regions 10R, 10G, 10B are also arranged along the first direction. In this embodiment, the sub-pixel regions 10R, 10G, 10B are defined as first sub-pixel region 10R, second sub-pixel region 10G and third sub-pixel region 10B, respectively.

Each of the pixel electrodes includes a primary electrode portion 20a, 21a, 22a and an extension electrode portion 20b, 21b, 22b connected to the primary electrode portion 20a, 21a, 22a, wherein the primary electrode portions 20a, 21a, 22a of the pixel electrodes are disposed in the corresponding sub-pixel regions 10R, 10G, 10B, respectively, and the extension electrode portions 20b, 21b, 22b of the pixel electrodes are disposed together in one of the sub-pixel regions. In this embodiment, the pixel electrodes are defines as first pixel electrode, second pixel electrode and third pixel electrode, wherein the primary electrode portion 20a of the first pixel electrode is disposed in the first sub-pixel region 10R; the primary electrode portion 21a of the second pixel electrode is disposed in the second sub-pixel region 10G; the primary electrode portion 22a of the third pixel electrode is disposed in the third sub-pixel region 10B; the extension electrode portions 20b, 21b, 22b of the first, the second and the third pixel electrodes are disposed together in the first sub-pixel region 10R. And the extension electrode portion 21b of the second pixel electrode insulatedly crosses over at least one of the gate lines (G2) to be connected to the primary electrode portion 21a of the second pixel electrode; the extension electrode portion 22b of the third pixel electrode insulatedly crosses over at least one of the gate lines (G2, G3) to be connected to the primary electrode portion 22a of the third pixel electrode. The pixel electrodes may further be overlapped with a common electrode line (not shown in the figure) so as to form storage capacitance.

The thin-film transistors T1, T2, T3 are disposed in the first, the second and the third sub-pixel regions 10R, 10G, 10B, respectively. A gate of each of the thin-film transistors T1, T2, T3 is electrically connected to the corresponding one of the gate lines G1, G2, G3; a source of each of the thin-film transistors T1, T2, T3 is electrically connected to the first data line D1; a drain of each of the thin-film transistors T1, T2, T3 is electrically connected to a corresponding one of the pixel electrodes. In this embodiment, the thin-film transistors T1, T2, T3 are first thin-film transistor T1, second thin-film transistor T2 and third thin-film transistor T3, wherein the first thin-film transistor T1 is connected to the extension electrode portion 20b of the first pixel electrode; the second thin-film transistor T2 is connected to the primary electrode portion 21a of the second pixel electrode; and the third thin-film transistor is connected to the primary electrode portion 22a of the third pixel electrode.

The pixel structure of the present invention is used in a 3D liquid crystal display device, and the basic structure of the 3D liquid crystal display device is similar to normal liquid crystal display devices and may include a first substrate, a second substrate and a liquid crystal layer, wherein the second substrate is opposite to the first substrate, and the liquid crystal layer is mounted between the first substrate and the second substrate. The first substrate has a plurality of gate lines and a plurality of data lines. The gate lines are arranged along the first direction. The data lines are arranged along a second direction to cross the gate lines to define a plurality of sub-pixel regions, wherein several adjacent sub-pixel regions further define a pixel region. And the pixel structure of the present invention in FIG. 7 is disposed in each of the pixel region. The second substrate has a color filter mounted thereon, with further reference to FIG. 8, the color filter has a photoresist structure 3 corresponding to the pixel structure.

Figure 8:
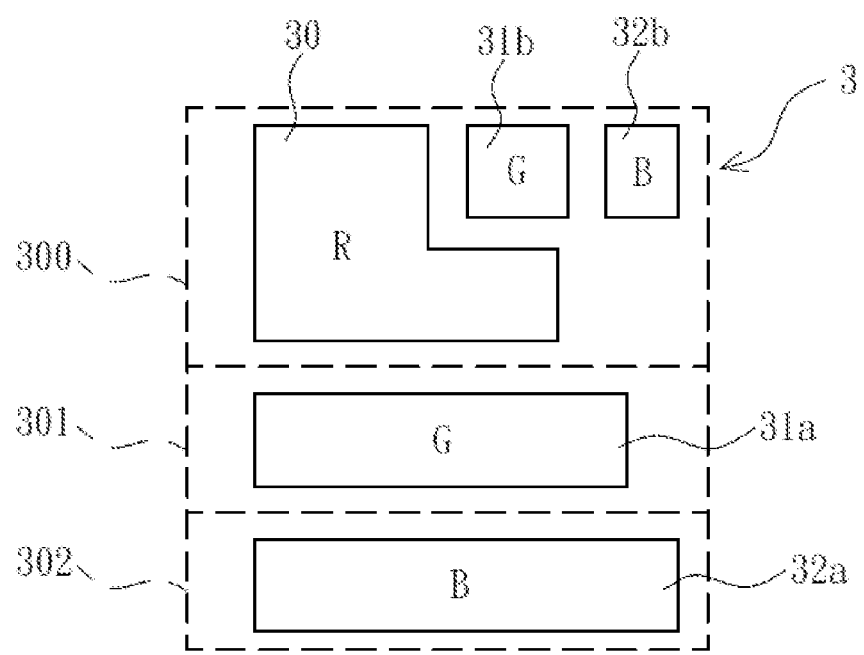
FIG. 8 is a schematic view of a preferred embodiment of a photoresist structure of a color filter of a 3D liquid crystal display device in accordance with the present invention.

As shown in FIG. 8, the photoresist structure 3 includes a first photoresist region 300, a second photoresist region 301 and a third photoresist region 302, wherein the first photoresist region 300, the second photoresist region 301 and the third photoresist region 302 correspond to the first sub-pixel region 10R, the second sub-pixel region 10G and the third sub-pixel region 10B, respectively; the first photoresist region 300 accommodates a first photoresist 30, a second photoresist 31b and a third photoresist 32b; the second photo region 301 accommodates a second photoresist 31a; and the third photoresist region 302 accommodates a third photoresist 32a. In this embodiment, the first photoresist 30 is a red photoresist; the second photoresist 31a, 31b are green photoresists; and the third photoresist 32a, 32b are blue photoresists.

In more details, the shape and the position of the first photoresist 30 in the first photoresist region 300 correspond to the overall shape and the overall position of both the primary electrode portion 20a and the extension electrode portion 20b of the first pixel electrode; the shape and the position of the second photoresist 31b in the first photoresist region 300 correspond to the shape and the position of the extension electrode portion 21b of the second pixel electrode; the shape and the position of the third photoresist 32b in the first photoresist region 300 correspond to the shape and the position of the extension electrode portion 22b of the third pixel electrode; the shape and the position of the second photoresist 31a in the second photoresist region 301 correspond to the shape and the position of the primary electrode portion 21a of the second pixel electrode; and the shape and the position of the third photoresist 32a in the third photoresist region 302 correspond to the shape and the position of the primary electrode portion 22a of the third pixel electrode.

It can be known from the above description that the extension electrode portions 20a, 21a, 22a in the first sub-pixel region 10R respectively correspond to different photoresists so as to display different colors so that the pixel structure in each pixel region can obtain an effect of color compensation under a top view angle or a bottom view angle, and then further improving the color washout problem which occurs due to the change of view angle.

Similar to other conventional 3D liquid crystal display device, the 3D liquid crystal display device having the pixel structure of the present invention may include at least one polarizer and a phase retarder film (not shown in the figure). The polarizer is used to be mounted on the second substrate. The phase retarder film is used to be mounted on an outer surface of the polarizer to be overlapped with the second substrate to achieve the 3D image display function. The phase retarder film may have a plurality of first phase retarder rows and a plurality of second phase retarder rows, wherein the second phase retarder rows and the first phase retarder rows are alternately arranged to covert linearly polarized images from the polarizer into left-handed circularly polarized images and right-handed circularly polarized images so as to use the left-handed circularly polarized images and the right-handed circularly polarized images as left-eye input images and right-eye input images, respectively. An angle between an optical axis of each of the first phase retarder rows and a transmission axis of the polarizer is 135 degrees; and an angle between an optical axis of each of the second phase retarder rows and a transmission axis of the polarizer is 45 degrees.

By the above description, the present invention is to divide each of the pixel electrodes into a primary electrode portion and an extension electrode portion in a tri-gate pixel arrangement, and place the primary electrode portions in the corresponding sub-pixel regions, respectively, and place the extension electrode portions of the pixel electrodes of one pixel unit in the same one of sub-pixel regions. Thus, comparing with a 3D liquid crystal display device to which the conventional tri-gate pixel structure is applied having a color washout problem under top and bottom view angles, the pixel structure of the present invention can use the colors displayed by the extension electrode portions disposed in the same sub-pixel region to achieve an effect of color compensation to further improve the color washout problem which occurs due to change of view angle.

The present invention has been described with a preferred embodiment thereof and it is understood that many changes and modifications to the described embodiment can be carried out without departing from the scope and the spirit of the invention that is intended to be limited only by the appended claims.

What is claimed is:

1. A pixel structure of a 3D liquid crystal display device comprising:
    four gate lines arranged along a first direction;
    a first data line and a second data line crossing the gate lines to define three oblong sub-pixel regions, and the three sub-pixel regions are a first sub-pixel region, a second sub-pixel region and a third sub-pixel region, and the sub-pixel regions are arranged along the first direction between the first and second data lines;
    three pixel electrodes which are a first pixel electrode, a second pixel electrode and a third pixel electrode, and each of the pixel electrodes has a primary electrode portion and an extension electrode portion connected to the primary electrode portion, wherein the primary electrode portions of the first, second and third pixel electrodes are disposed in the first, second and third sub-pixel regions, respectively; the extension electrode portions of the first, second and third pixel electrodes are disposed in the first sub-pixel region; and
    three thin-film transistors which are a first thin-film transistor, a second thin-film transistor and a third thin-film transistor, and the thin-film transistors are disposed in the first, second and third sub-pixel regions, respectively, wherein a gate of each of the thin-film transistors is electrically connected to a corresponding one of the gate lines; a source of each of the thin-film transistors is electrically connected to the first data line; and a drain of each of the thin-film transistors is electrically connected to a corresponding one of the pixel electrodes.

2. The pixel structure of the 3D liquid crystal display device as claimed in claim 1, wherein the first thin-film transistor is connected to the extension electrode portion of the first pixel electrode; the second thin-film transistor is connected to the primary electrode portion of the second pixel electrode; the third thin-film transistor is connected to the primary electrode portion of the third pixel electrode.

3. The pixel structure of the 3D liquid crystal display device as claimed in claim 1, wherein the extension electrode portion of the second pixel electrode insulatedly crosses over at least one of the gate lines to be connected to the primary electrode portion of the second pixel electrode; the extension electrode portion of the third pixel electrode insulatedly crosses over at least one of the gate lines to be connected to the primary electrode portion of the third pixel electrode.

4. A pixel structure of a 3D liquid crystal display device comprising:
    four gate lines arranged along a first direction;
    a first data line and a second data line crossing the gate lines to define three oblong sub-pixel regions, and the sub-pixel regions are arranged along the first direction between the first and second data lines; and three pixel electrodes, and each of the pixel electrodes has a primary electrode portion and an extension electrode portion connected to the primary electrode portion, wherein the primary electrode portions of the pixel electrodes are disposed in the sub-pixel regions, respectively; the extension electrode portions of the pixel electrodes are disposed together in one of the sub-pixel regions.

5. The pixel structure of the 3D liquid crystal display device as claimed in claim 4, wherein the pixel structure further includes three thin-film transistors that are disposed in the sub-pixel regions, respectively, and a gate of each of the thin-film transistors is electrically connected to a corresponding one of the gate lines; a source of each of the thin-film transistors is electrically connected to the first data line; and a drain of each of the thin-film transistors is electrically connected to a corresponding one of the pixel electrodes.

6. The pixel structure of the 3D liquid crystal display device as claimed in claim 4, wherein
the sub-pixel regions are a first sub-pixel region, a second sub-pixel region and a third sub-pixel region; the primary electrode portions of the first, the second and the third pixel electrodes are disposed in the first, the second and the third pixel regions, respectively; the extension electrode portions of the first, the second and the pixel electrodes are disposed in the first sub-pixel region; and
the pixel structure corresponds to a photoresist structure of a color filter, wherein the photoresist structure includes a first photoresist region, a second photoresist region and a third photoresist region, wherein the positions of the first, the second and the third photoresist corresponds to the positions of the first, the second and the third sub-pixel regions, respectively; the first photoresist region accommodates a first photoresist, a second photoresist and a third photoresist; the second photo region accommodates a second photoresist; and the third photoresist region accommodates a third photoresist.

7. The pixel structure of the 3D liquid crystal display device as claimed in claim 6, wherein
the shape and the position of the first photoresist in the first photoresist region correspond to the overall shape and the overall position of both the primary electrode portion and the extension electrode portion of the first pixel electrode; the shape and the position of the second photoresist in the first photoresist region correspond to the shape and the position of the extension electrode portion of the second pixel electrode; the shape and the position of the third photoresist in the first photoresist region correspond to the shape and the position of the extension electrode portion of the third pixel electrode;
the shape and the position of the second photoresist in the second photoresist region correspond to the shape and the position of the primary electrode portion of the second pixel electrode; and
the shape and the position of the third photoresist in the third photoresist region correspond to the shape and the position of the primary electrode portion of the third pixel electrode.

8. The pixel structure of the 3D liquid crystal display device as claimed in claim 6, wherein
the extension electrode portion of the second pixel electrode insulatedly crosses over at least one of the gate lines to be connected to the primary electrode portion of the second pixel electrode; the extension electrode portion of the third pixel electrode insulatedly crosses over at least one of the gate lines to be connected to the primary electrode portion of the third pixel electrode.

9. A 3D liquid crystal display device comprising:
a first substrate including a plurality of pixel regions, and each of the pixel regions accommodates a pixel structure, and the pixel structure has:
four gate lines arranged along a first direction;
a first data line and a second data line crossing the gate lines to define three oblong sub-pixel regions, and the sub-pixel regions are arranged along the first direction between the first and second data lines; and
three pixel electrodes, and each of the pixel electrodes has a primary electrode portion and an extension electrode portion connected to the primary electrode portion, wherein the primary electrode portions of the three pixel electrodes are disposed in the sub-pixel regions, respectively; the extension electrode portions of the pixel electrodes are disposed together in one of the sub-pixel regions;
a second substrate being opposite to the first substrate;
a liquid crystal layer mounted between the first substrate and the second substrate; and
a phase retarder film being overlapped with the second substrate.

10. The 3D liquid crystal display device as claimed in claim 9, wherein the pixel structure further includes three thin-film transistors that are disposed in the sub-pixel regions, respectively, and a gate of each of the thin-film transistors is electrically connected to a corresponding one of the gate lines; a source of each of the thin-film transistors is electrically connected to the first data line; and a drain of each of the thin-film transistors is electrically connected to a corresponding one of the pixel electrodes.

11. The 3D liquid crystal display device as claimed in claim 9, wherein the 3D liquid crystal display device further comprises a polarizer mounted on the second substrate; and the phase retarder film is mounted on an outer surface of the polarizer and has:
a plurality of first phase retarder rows; and
a plurality of second phase retarder rows, wherein the second phase retarder rows and the first phase retarder rows are alternately arranged.

12. The 3D liquid crystal display device as claimed in claim 11, wherein an angle between an optical axis of each of the first phase retarder rows and a transmission axis of the polarizer is 135 degrees; and an angle between an optical axis of each of the second phase retarder rows and a transmission axis of the polarizer is 45 degrees.

13. The 3D liquid crystal display device as claimed in claim 9, wherein
the sub-pixel regions are a first sub-pixel region, a second sub-pixel region and a third sub-pixel region; the primary electrode portions of the first, the second and the third pixel electrodes are disposed in the first, the second and the third pixel regions, respectively; the extension electrode portions of the first, the second and the pixel electrodes are disposed in the first sub-pixel region; and
the second substrate has a color filter mounted thereon, and the color filter has a photoresist structure corresponding to the pixel structure on the first substrate; and the photoresist structure includes a first photoresist region, a second photoresist region and a third photoresist region, wherein the positions of the first, the second and the third photoresist corresponds to the positions of the first, the second and the third sub-pixel regions, respectively; the first photoresist region accommodates a first photoresist, a second photoresist and a third photoresist; the second photo region accommodates a second photoresist; and the third photoresist region accommodates a third photoresist.

\* \* \* \* \*